US006265944B1

(12) United States Patent
Conta et al.

(10) Patent No.: US 6,265,944 B1
(45) Date of Patent: Jul. 24, 2001

(54) FULLY INTEGRATED BROADBAND RF VOLTAGE AMPLIFIER WITH ENHANCED VOLTAGE GAIN AND METHOD

(75) Inventors: Matteo Conta, Irvine; Akbar Ali, Garden Grove, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/405,766

(22) Filed: Sep. 27, 1999

(51) Int. Cl.[7] .................. H03F 3/45; H03F 3/04; H03F 3/14
(52) U.S. Cl. ................. 330/302; 330/257; 330/307
(58) Field of Search ................... 330/253, 257, 330/252, 302, 307, 310

(56) References Cited

U.S. PATENT DOCUMENTS

| | | | | |
|---|---|---|---|---|
| 4,771,247 | * | 9/1988 | Jacomb-Hood | 330/307 |
| 4,901,032 | * | 2/1990 | Komiak | 330/277 |
| 4,973,915 | * | 11/1990 | Batey | 330/151 |
| 5,231,660 | * | 7/1993 | West, Jr. | 455/1 |
| 5,397,978 | * | 3/1995 | Parry et al. | 323/280 |
| 5,907,242 | * | 5/1999 | Gard | 324/326 |
| 6,026,286 | * | 2/2000 | Long | 455/327 |

\* cited by examiner

*Primary Examiner*—Robert Pascal
*Assistant Examiner*—Patricia T. Nguyen
(74) *Attorney, Agent, or Firm*—Foley & Lardner

(57) ABSTRACT

RF voltage amplifier circuits which have high voltage amplifier gain and input signal frequency range, and a method for boosting the voltage amplifier gain and input signal frequency range in such circuits is provided. A method includes the steps of providing a voltage amplifier having a transistor with the grounded source and the drain connected to a power supply via a resistive load, and providing an integrated inductor for biasing the transistor, having an inductor connecting an input signal terminal to the gate of the transistor and a capacitor connecting the gate and the source of the transistor. The next step includes selecting a resonant frequency of the integrated inductor at a frequency where the voltage amplifier gain is starting to roll-off, for boosting the voltage amplifier gain and the input signal frequency range. The integrated inductor preferably operates at a resonant frequency approximately matching the roll-off frequency of the voltage amplifier. In another embodiment the voltage amplifier has a common emitter (CE) gain stage, a common base (CB) cascade stage directly-coupled to the CE gain stage, and a constant current mirror source. The integrated inductor has two inductors, each connected to one input of the amplifier input signal pair and a capacitor connecting the inductors. This circuit can be adapted for fully differential operation mode or for single ended operation mode.

25 Claims, 2 Drawing Sheets

FULLY INTEGRATED BROADBAND RF VOLTAGE AMPLIFIER WITH ENHANCED VOLTAGE GAIN AND METHOD

BACKGROUND OF THE INVENTION

1. Field of the Invention

The present invention relates generally to the field of voltage amplifier circuits and more particularly to an improved broadband radio frequency (RF) voltage amplifier circuit for communication devices, which includes a resonant circuit used to provide enhanced voltage gain, and a method for boosting the voltage amplifier gain and input signal frequency range in such a circuit.

2. Related Art

Many of today's conventional complementary metal-oxide-silicon (CMOS) field effect transistor (FET) amplifiers obtain the needed high gain by using two stages of voltage amplification, with each stage comprising a pair of load devices, a differential pair of devices and a current source, or by using a single stage voltage amplifier having a pair of load devices, two separate pairs of cascade devices, a differential pair of devices and a current source.

Conventional voltage amplifiers, usable in phase-locked loops (PLLs) of communication devices, typically utilize a gm-R voltage amplifier stage, for example, comprising a cascade of voltage amplifiers. Conventional gm-R voltage amplifiers may be made with bipolar technology, and may have resistive load or active load. Such conventional voltage amplifiers work only at frequency roll-off and thus are not flexible. Therefore, they are impractical in circuits needing to provide large frequency range, such as PLLs of communication devices. Thus, some conventional voltage amplifiers are additionally equipped with an external LC circuit, which is used as a bandpass filter and can only accept input amplifier signals within a narrow frequency bandwidth.

Therefore, conventional voltage amplifier circuits typically have limited use in high gain operations in RF voltage amplifier circuits because they cannot satisfy wide enough frequency bandwidth requirement of these circuits. Accordingly, there is a need in the art for an improved RF voltage amplifier circuit which operates at high gain with low power consumption, usable in communication devices. There is also a need for a method for increasing voltage gain and frequency bandwidth of an RF voltage amplifier circuit usable in communication devices.

SUMMARY OF THE DISCLOSURE

It is therefore an object of preferred embodiments of the present invention to provide a broadband RF voltage amplifier circuit which provides increased voltage gain and frequency bandwidth. The present invention includes several voltage amplifier circuit embodiments which can operate at high frequencies at wide frequency bandwidth, and corresponding method embodiments for increasing voltage gain and input signal frequency range in such circuits.

A preferred method embodiment includes the steps of providing a voltage amplifier and an integrated inductor for biasing the voltage amplifier. The next step involves selecting a resonant frequency of the integrated inductor at a frequency where the voltage amplifier gain is starting to roll-off, for boosting the voltage amplifier gain and the input signal frequency range. The integrated inductor preferably operates at a resonant frequency approximately matching the roll-off frequency of the voltage amplifier.

A first apparatus embodiment of the present invention includes a voltage amplifier having a transistor with the grounded source and the drain connected to a power supply via a resistive load, and an integrated inductor, for biasing the transistor, having an inductor connecting an input signal terminal to the gate of the transistor and a capacitor connecting the gate and the source of the transistor.

In another apparatus embodiment of the present invention, the voltage amplifier has a common emitter (CE) gain stage, a common base (CB) cascade stage directly-coupled to the CE gain stage, and a constant current mirror source. The integrated inductor has two inductors, each connected to one input of the amplifier input signal pair and a capacitor connecting the inductors. This circuit can be adapted for fully differential operation mode or for single ended operation mode.

BRIEF DESCRIPTION OF THE DRAWINGS

Referring now to the drawings, in which like reference numbers represent corresponding parts throughout.

DETAILED DESCRIPTION OF PREFERRED EMBODIMENTS

In the following description, reference is made to the accompanying drawings which form a part hereof, and in which are shown, by way of illustration, several embodiments of the present invention. It is understood that other embodiments may be utilized and structural changes may be made without departing from the scope of the present invention.

RF voltage amplifiers can be implemented using a variety of different technologies, depending on the application of use. The present invention relates generally to an improved RF voltage amplifier circuit, usable for broadband, high frequency applications, such as in PLL s of communication devices. In such case, it is common to use a multistage voltage amplifier to achieve the best performance. Specifically, the present invention includes a method for increasing RF voltage amplifier gain and frequency bandwidth at frequencies where voltage amplifier gain starts to roll-off, and several embodiments of voltage amplifier circuits, preceded by an inductor element, preferably fully integrated on the same chip with the voltage amplifier, so as to perform multi-stage voltage amplification.

The integrated inductor is preferably a voltage transformer-like monolithic network connected at amplifier input, which performs voltage transformation to obtain higher voltage magnitude at the amplifier input, thus enhancing amplifier's voltage gain, at the same current consumption as in a corresponding conventional circuit. The voltage amplifiers of preferred embodiments of the present invention perform with lower power requirement, because the integrated inductor performs at higher frequency than the voltage amplifier, in order to boost the gain. Voltage amplifier circuit embodiments of the present invention maintain voltage gain of a corresponding conventional voltage amplifier circuit at low frequencies, and boost voltage gain at high frequencies. Moreover, the voltage amplifier circuits of preferred embodiments of the present invention perform at wide frequency bandwidth, unlike the conventional circuits which utilize a bandpass filter.

Figure 1:
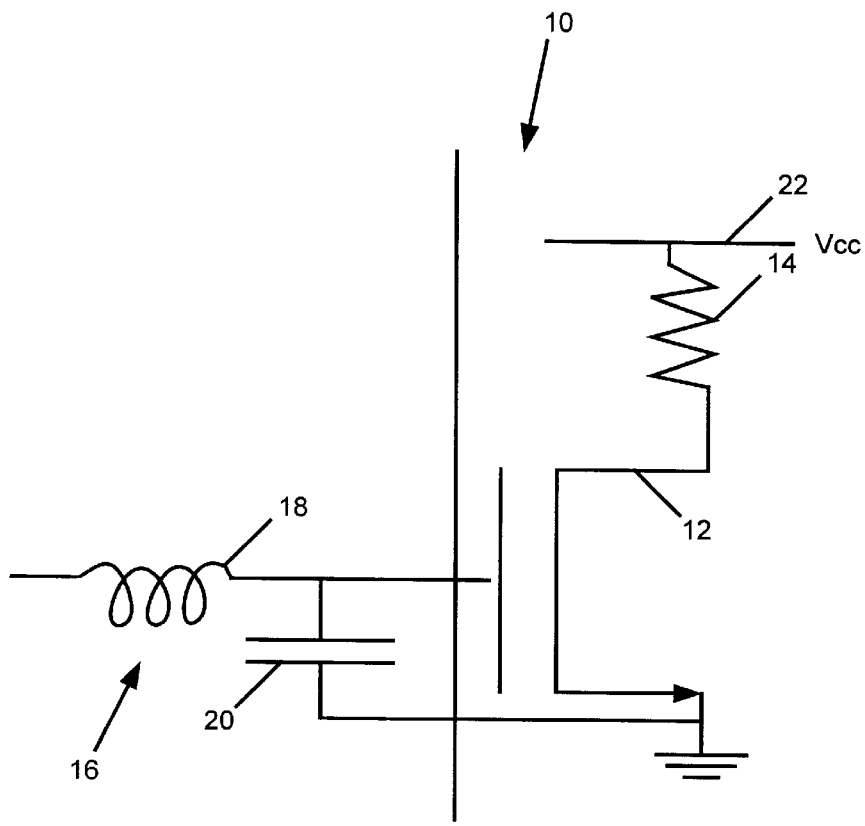
FIG. 1 is a schematic diagram of a broadband RF voltage amplifier circuit, according to an embodiment of the present invention.
Figure 2:
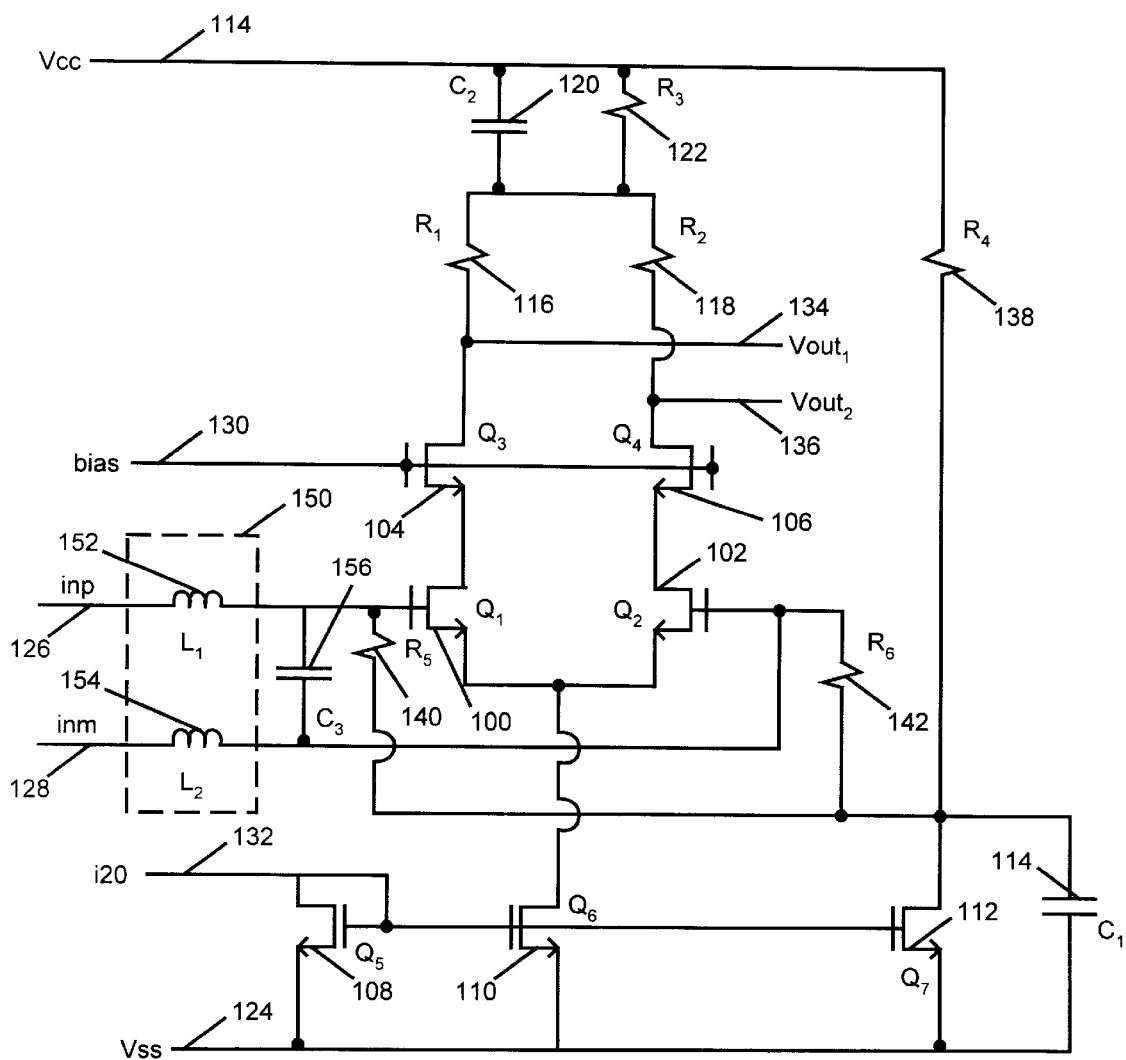
FIG. 2 is a schematic diagram of a broadband RF voltage amplifier circuit, according to another embodiment of the present invention.

Preferred embodiments of the present invention are described herein primarily with reference to FIG. 1 and FIG. 2. However, it will be understood that further embodiments are possible with other types of circuits, provided that they utilize the method of the present invention, in order to obtain an RF voltage amplifier circuit with increased voltage gain and frequency bandwidth, at the same power requirement. Details of the circuit elements presented in FIG. 1 and FIG. 2 which are well known in the art and are not described herein for purposes of simplifying the present disclosure.

According to one preferred embodiment, a schematic diagram of an improved broadband RF voltage amplifier circuit of the present invention is shown in FIG. 1. The device employs a voltage amplifier 10, preferably utilizing a FET transistor 12, having the grounded source and the drain connected to a power supply $V_{CC}$ 22 via a resistive load 14. The transistor 12 is biased with a transformer-like monolithic network 16, preferably utilizing an integrated inductor. The integrated inductor implements an inductor 18, connecting an amplifier input signal terminal to the gate of the transistor 12, and a capacitor 20 connected between the gate and source of the transistor 12. The integrated inductor performs at resonant frequency selected where the voltage amplifier gain starts to roll-off, in order to boost the system voltage gain and input signal frequency range. Preferably, the integrated inductor resonant frequency approximately matches the roll-off frequency of the voltage amplifier to boost the voltage amplifier gain and input signal frequency range. The transistor 12 is preferably a FET transistor and the integrated inductor is fully integrated on the same chip with the voltage amplifier.

Referring now to FIG. 2, there is illustrated a broadband RF voltage amplifier circuit in accordance with another embodiment of the present invention. The circuit of FIG. 2 is a two stage differential voltage amplifier which has a common emitter (CE) gain stage directly-coupled to a common base (CB) cascade stage. The two stage differential voltage amplifier has two emitter-coupled first and second gain stage devices comprising transistors Q1 100 and Q2 102, third and fourth cascade stage switching devices comprising transistors Q3 104 and Q4 106, and a constant current source comprising current mirror transistors Q5 108, Q6 110 and Q7 112.

The transistors Q1 100 and Q2 102 are used to increase voltage gain and frequency bandwidth of the voltage amplifier. The transistors Q3 104 and Q4 106 are used to increase output resistor load and frequency bandwidth to allow wider range of input signal frequencies. The drains of the transistors Q3 104 and Q4 106 are coupled to a first power supply $V_{CC}$ 114, via load resistors R1 116 and R2 118. In one preferred embodiment, there may be a capacitor C2 120 tied in parallel with a resistor R3 122 between the resistors R1 116, R2 118, and the power supply $V_{CC}$ 114. The capacitor C2 120 and the resistor R3 122 represent a capacitive load on the drains of Q3 104 and Q4 106 transistors and may be used for reducing power supply voltage $V_{CC}$ 114 in common mode.

The sources of the current mirror transistors Q5 108, Q6 110 and Q6 112 are coupled to a second power supply $V_{SS}$ 124, preferably at ground potential level. The gate terminals of the transistors Q1 100 and Q2 102 are coupled to a first input differential signal pair with potential inp 126 and its complement inm 128, respectively, which are complementary voltage amplifier inputs. The gate terminals of Q3 104 and Q4 106 transistors are coupled to a dc bias reference potential bias 130. In this circuit, it is preferred that the bias 130 signal has very low and very stable potential magnitude. The gate terminals of the current mirror transistors Q5 108, Q6 110 and Q6 112 are coupled to a third reference potential i20u 132, used to provide bias current for the current mirrors. The drain terminal of the transistor Q5 108 is also coupled to the third reference potential i20u 132.

The transistors Q1 100 and Q2 102 are source-followers, whose sources are connected to the drain of the constant current source transistor Q6 110, to maintain a predetermined current flow in the differential transistor pair and the cascade transistor pair. The drain output terminals of the transistors Q1 100 and Q2 102 are coupled to the source terminals of Q3 104 and Q4 106, respectively. The drains of the transistors Q3 104 and Q4 106 serve as complementary voltage amplifier output terminals $V_{OUT1}$ 134 and $V_{OUT2}$ 136.

Assuming the transistors Q1 100 and Q2 102 of the differential pair are identical, the current from the constant current source will be divided equally between the differential transistor branches, half flowing from the source to drain of the transistor Q1 100 and then to the source of the transistor Q3 104 of the cascade pair. The other half of the current from the constant current source flows from the source to drain of the transistor Q2 102 and then to the source of the transistor Q4 106 of the cascade pair.

The drain of the transistor Q7 112 is commonly connected to resistors R4 138, R5 140, R6 142 and a capacitor C1 144. The capacitor C1 144 is used to provide filtering of the high frequency component of the bias voltage and create a dc voltage. The other end of the capacitor C1 144 is attached to the power supply $V_{SS}$ 124. The other end of the resistor R4 138 is attached to the power supply $V_{CC}$ 114. The other ends of the resistors R5 140, R6 142 are attached to the gates of transistors Q1 100, Q2 102, respectively.

Resistor R4 138 is a bias resistor, i.e., a bias component used to provide the dc voltage for the resistors R5 140, R6 142. The resistors R5 140, R6 142 are used to set common mode signal at the gates of the transistors Q1 100 and Q2 102, at low frequency, to provide the common dc voltage at these gates. The resistors R5 140, R6 142 have no effect at high frequencies because they have very high resistance values.

The voltage amplifier circuits of the present invention may also be referred to as pre-amplifiers, because they directly receive the input signals on the input terminals inp 126 and inm 128 from a circuit, such as a PLL loop, not shown. The circuit of FIG. 2 preferably obtains the input signals from a voltage controlled oscillator (VCO) element, not shown, of the PLL loop.

Voltage gain of the voltage amplifier circuit of FIG. 2 is boosted in large frequency range by a resonant circuit. Preferably, the resonant circuit consists of an integrated (monolithic) inductor 150, and the input signal terminals inp 126 and inm 128 of the voltage amplifier are attached to the inputs of the integrated inductor 150. The monolithic inductor 150 includes an inductor L1 152 at the gate of the transistor Q1 100, an inductor L2 154 at the gate of the transistor Q2 102, and a capacitor C3 156 between the gates of the transistors Q1 100 and Q2 102.

Because external inductors are expensive to use, preferred embodiments of the present invention utilizes a monolithic, internal inductor 150, implemented within the integrated chip with the voltage amplifier, which reduces the cost, is more convenient, makes the voltage amplifier smaller, and provides wider frequency bandwidth. With the state of the current technology, the internal inductor 150 can only be used at frequencies above 900 MHz, because at lower frequencies the integrated inductor 150 is too big to implement on the chip.

In preferred embodiments of the present invention, the cascade transistor devices are smaller than the gain transistor devices, which are chosen to provide high gain increase. Since they are not frequency sensitive, the cascade transistor devices are used to reduce the output dominant pole, and thus increase the total frequency bandwidth of the voltage amplifier by reducing parasitic capacitance at the voltage amplifier circuit outputs 134, 136.

The two transistors in the gate stage pair and the two transistors in the cascade stage pair are preferably matched as closely as possible. Preferably, each transistor used in the integrated circuitry of the present invention is an n-channel MOSFET transistor, but it could also be implemented in bipolar, CMOS or other technology, and any other suitable device. The transformer network can be any monolithic inductor type known in the industry and preferably is a spiral inductor using metal coil. The current source may be any suitable current source configured to provide a constant current. The power supplies $V_{CC}$ 114 and $V_{SS}$ 124 are preferably at dc voltage level.

The voltage amplifier circuit of FIG. 2 may be utilized in fully differential operation mode, with fully differential input signals inp 126 and inm 128, or in single ended operation mode, with single ended input signals inp 126 and inm 128. The mode only changes the value of circuit component parameters.

In single ended operation mode only one input signal is swinging and the other input signal is grounded. In this mode the parameter value of components in the left and right branch of the differential voltage amplifier are not the same, especially in the gain stage and in passive loads, in order to compensate for lack of balance created by one input signal being grounded.

In fully differential operation mode, both input signals are swinging and they have opposite sign at any given moment. For this mode the voltage amplifier circuit of FIG. 2 is totally symmetric in the two differential branches. In order to work in fully differential operation mode, the integrated inductor 150 circuit has to use two inductors. Therefore, the device of FIG. 1 cannot operate in this mode and the device of FIG. 2 can. When the input signals is coming from a VCO of a PLL, the voltage amplifier is used in fully differential operation mode.

The components of the voltage amplifier circuit of FIG. 2 that do not have a corresponding symmetrical component in the circuit are common mode components and their parameter value is the same in the single ended operation mode and the fully differential operation mode.

In some applications it is desirable to provide input signal terminals inp 126 and inm 128 of the voltage amplifier with a common dc offset level.

Figure 3:
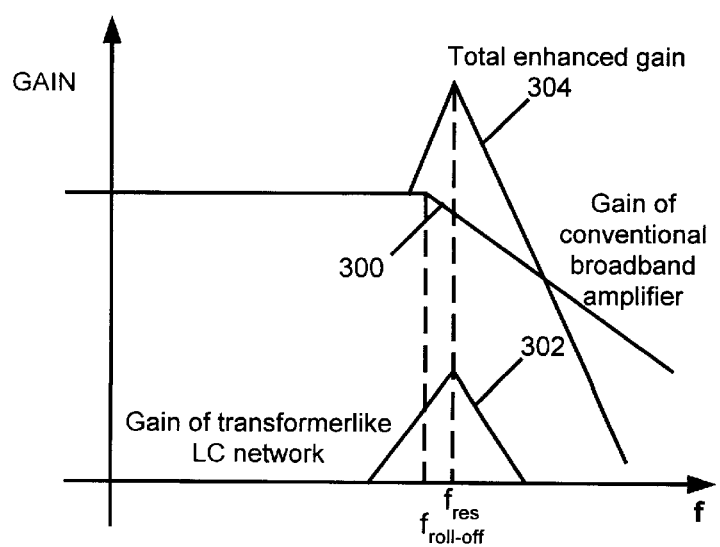
FIG. 3 is a gain v. frequency response diagram corresponding to preferred embodiments of the present invention.

FIG. 3 illustrates a gain v. frequency response diagram, showing that total enhanced gain 304 of the voltage amplifier circuits of an embodiment of the present invention, represented with the sum of a gain 300 of the broadband RF voltage amplifier and a gain 302 of the transformer-like integrated inductor 150 network. The total enhanced gain 304 shows an increase in gain at the resonant frequency of the integrated inductor 150, which is chosen to approximately correspond to the roll-off frequency of the voltage amplifier, where the voltage amplifier stage voltage gain starts to drop. Thus, the frequency bandwidth of the voltage amplifier for the same current level (when the voltage gain of the voltage amplifier starts dropping at high frequency) is increased. Therefore the voltage amplifier circuits of preferred embodiments of the present invention can amplify at higher frequencies with less power consumption, when the gain 300 drops, so that the total gain stays the same as in a corresponding conventional voltage amplifier circuit.

At low frequencies the voltage amplifier circuits of preferred embodiments of the present invention behave as if the integrated inductor 150 network is not present, and maintain the gain of a corresponding conventional voltage amplifier, because at low frequencies the integrated inductor 150 is short circuited and its gain is zero. Therefore, the voltage amplifier circuits of the present invention are broadband circuits, although they are using inductors, and can provide great flexibility and allow wider range of input signal frequencies.

The voltage amplifier circuit of FIG. 2 was tested in simulation. Since the design parameters were chosen to boost the voltage gain at resonant frequency of the internal inductor 150, the parameters of the corresponding elements in the two differential branches of the voltage amplifier were chosen to obtain optimal performance. The first simulation step was to chose the monolithic inductor's 150 resonant frequency to approximately match the voltage amplifier's roll-off frequency, where its gain is starting to drop in amplitude. The second step was to chose the parameters of the monolithic inductor's 150 elements (inductors and/or capacitor), according to the chosen resonant frequency. The simulation showed that the gain of the monolithic inductor (Q) obtained value Q=2.5 at resonant frequency Fres=1.8 GHz, for CMOS circuits, which means that the total gain of the voltage amplifier was increased 2.5 times. It has been found that the Q parameter depends on the purity of the components of the monolithic inductor 150. The improved voltage amplifier circuits of the present invention have also obtained improved gain bandwidth product (GBP), which in these circuits became independent from the input current level.

A method embodiment of the present invention for increasing the RF voltage amplifier gain and frequency bandwidth of the RF voltage amplifier of FIG. 1 includes the steps of providing a voltage amplifier having a transistor with the grounded source and the drain connected to a power supply via a resistive load, and providing an integrated inductor for biasing the transistor, having an inductor connecting an input signal terminal to the gate of the transistor and a capacitor connecting the gate and the source of the transistor. The next step includes selecting a resonant frequency of the integrated inductor at a frequency where the voltage amplifier gain is starting to roll-off, for boosting the voltage amplifier gain and input signal frequency range. The integrated inductor preferably operates at a resonant frequency approximately matching the roll-off frequency of the voltage amplifier.

A method embodiment of the present invention for increasing the RF voltage amplifier gain and frequency bandwidth of the RF voltage amplifier of FIG. 2 includes the steps of providing a voltage amplifier having a common emitter (CE) gain stage, a common base (CB) cascade stage directly-coupled to the CE gain stage, and a constant current mirror source, and further providing an integrated inductor for biasing the voltage amplifier. The integrated inductor is connected between the gates of the CE gain stage transistors and an amplifier input signal pair, for increasing the magnitude of input voltage to the CE gain stage. Further step includes selecting a resonant frequency of the integrated inductor at a frequency where the voltage amplifier gain is starting to roll-off, for boosting the voltage amplifier gain and input signal frequency range. The integrated inductor preferably operates at a resonant frequency approximately matching the roll-off frequency of the voltage amplifier. The method further has a step for adapting the voltage amplifier for fully differential operation mode or for single ended operation mode.

With the method and the improved voltage amplifier circuits of preferred embodiments of the present invention, it is possible to obtain at least a 250% increase in voltage gain at the same power level required in a corresponding conventional circuit. Therefore, embodiments of the present invention find application in devices capable of high frequency operation, which require high voltage gain at wide input signal bandwidth, such as in communicational devices. Some such circuits are PLLs of frequency synthesizers, usable at radio frequencies, but the devices of the present invention may be used in other broadband high frequency applications, such as high frequency preamplifiers, amplifiers, and cables.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A broadband RF voltage amplifier system comprising:
   a power supply;
   an input signal terminal;
   a voltage amplifier having a transistor, said transistor having the grounded source and the drain connected to the power supply via a resistive load;
   an integrated inductor for biasing said transistor, said integrated inductor having an inductor connecting the input signal terminal to the gate of the transistor and a capacitor connecting the gate and the source of the transistor; and
   wherein the integrated inductor performing at resonant frequency selected at a frequency wherein the voltage amplifier gain starting to roll-off, for boosting the system voltage gain and the amplifier input signal frequency range.

2. The system of claim 1 wherein the integrated inductor resonant frequency approximately matching the roll-off frequency of the voltage amplifier for boosting the voltage amplifier gain and input signal frequency range.

3. The system of claim 1 wherein the transistor being a FET transistor.

4. The system of claim 1 wherein the integrated inductor fully integrated on the same chip with the voltage amplifier.

5. A multi-stage broadband RF differential voltage amplifier system comprising:
   a first power supply;
   a second power supply;
   a complementary voltage amplifier input pair;
   a common emitter (CE) gain stage having a first and second gain transistor;
   a common base (CB) cascade stage directly-coupled to the CE gain stage, having a third and fourth cascade stage transistor, wherein the drains of the third and fourth transistor coupled to a first power supply via a resistor load, and the gate terminals of the third and fourth transistor coupled to a dc bias reference potential;
   a constant current mirror source having a fifth, a sixth and a seventh transistor, wherein the sources of the current mirror transistors coupled to the second power supply, the gate terminals of the current mirror transistors and the drain of the fifth transistor coupled to a third reference potential, and the sources of the first and second transistor connected to the drain of the sixth transistor;
   a means for filtering and providing dc bias voltage for the first and second transistor, connected to the drain of the seventh transistor;
   an integrated inductor connected between the gates of the first and second transistor and the complementary voltage amplifier input pair, for increasing the magnitude of input voltage to the CE gain stage; and
   wherein the integrated inductor performing at resonant frequency selected at a frequency wherein the differential voltage amplifier gain starting to roll-off, for boosting the system voltage gain and the amplifier input signal frequency range.

6. The system of claim 5 wherein the integrated inductor resonant frequency approximately matching the roll-off frequency of the differential voltage amplifier.

7. The system of claim 5 wherein said integrated inductor having two inductors, each connected to one respective input of the complementary voltage amplifier input pair and a capacitor connecting the inductors.

8. The system of claim 5 wherein the transistors being MOSFET transistors.

9. The system of claim 5 wherein the integrated inductor and the voltage amplifier fabricated in a single semiconductor chip.

10. The system of claim 5 further comprising a capacitive load on the drains of the third and fourth transistor.

11. The system of claim 5 being adapted for fully differential operation mode.

12. The system of claim 5 being adapted for single ended operation mode.

13. A method of multi-stage voltage amplification for increasing RF voltage amplifier gain and frequency bandwidth, comprising the steps:
   providing a voltage amplifier having a transistor, said transistor having the grounded source and the drain connected to a power supply via a resistive load;
   providing an integrated inductor for biasing said transistor, said integrated inductor having an inductor connecting an input signal terminal to the gate of the transistor and a capacitor connecting the gate and the source of the transistor; and
   selecting a resonant frequency of the integrated inductor at a frequency wherein the voltage amplifier gain starting to roll-off, for boosting the voltage amplifier gain and the input signal frequency range.

14. The method of claim 13 wherein said integrated inductor operating at a resonant frequency approximately matching the roll-off frequency of the voltage amplifier for boosting the voltage amplifier gain and input signal frequency range.

15. A method of multi-stage voltage amplification for increasing RF voltage amplifier gain and frequency bandwidth, comprising the steps:
   providing a voltage amplifier having a common emitter (CE) gain stage, a common base (CB) cascade stage directly-coupled to the CE gain stage, and a constant current mirror source;

providing an integrated inductor for biasing said voltage amplifier, said integrated inductor connected between the gates of the CE gain stage transistors and an amplifier input signal pair, for increasing the magnitude of input voltage to the CE gain stage; and selecting a resonant frequency of the integrated inductor at a frequency wherein the voltage amplifier gain starting to roll-off, for boosting the voltage amplifier gain and the input signal frequency range.

16. The method of claim 15 wherein said integrated inductor operating at a resonant frequency approximately matching the roll-off frequency of the voltage amplifier for boosting the voltage amplifier gain and input signal frequency range.

17. The method of claim 15 wherein said integrated inductor having two inductors, each connected to one input of the amplifier input signal pair and a capacitor connecting the inductors.

18. The method of claim 15 further comprising a step for adapting the voltage amplifier for fully differential operation mode.

19. The method of claim 15 further comprising a step for adapting the voltage amplifier for single ended operation mode.

20. The system of claim 1, wherein the integrated inductor is part of a monolithic network.

21. The system of claim 1, wherein the integrated inductor operates at frequencies above 900 MHz.

22. The system of claim 1, wherein the integrated inductor is a spiral inductor.

23. The method of claim 13, wherein the step of providing an integrated inductor comprises providing the integrated inductor as part of a monolithic network.

24. The method of claim 13, wherein the step of selecting a resonant frequency comprises selecting a resonant frequency above 900 MHz.

25. The method of claim 13, wherein the step of providing an integrated inductor comprises providing a spiral inductor.

* * * * *